United States Patent [19]

Caprara et al.

[11] Patent Number: 5,440,510
[45] Date of Patent: Aug. 8, 1995

[54] INTEGRATED CIRCUIT ENTIRELY PROTECTED AGAINST ULTRAVIOLET RAYS

[75] Inventors: Paolo Caprara, Milan; Emilio Camerlenghi, Bergamo, both of Italy

[73] Assignee: SGS-Thomson Microelectronics, S.R.L., Agrate Brianza, Italy

[21] Appl. No.: 86,342

[22] Filed: Jun. 30, 1993

[30] Foreign Application Priority Data

Jun. 30, 1992 [EP] European Pat. Off. ............ 92830339

[51] Int. Cl.⁶ .............................................. G11C 11/34
[52] U.S. Cl. ...................................... 365/185; 365/53; 365/104; 365/218; 257/314; 257/315; 257/323
[58] Field of Search ................ 365/53, 185, 164, 218; 257/314, 315, 316, 317, 323

[56] References Cited

U.S. PATENT DOCUMENTS

| | | | |
|---|---|---|---|
| 4,519,050 | 5/1985 | Folmsbee | 365/53 |
| 4,530,074 | 7/1985 | Folmsbee | 365/53 |
| 4,577,295 | 3/1986 | Eitan et al. | 365/218 |
| 4,758,869 | 7/1988 | Eitan et al. | |
| 4,805,138 | 2/1989 | McElroy et al. | 365/53 |
| 4,970,565 | 11/1990 | Wu | |
| 5,034,786 | 7/1991 | Eitan | |
| 5,050,123 | 9/1991 | Castro | 365/53 |
| 5,086,410 | 2/1992 | Bergemont | 365/53 |

FOREIGN PATENT DOCUMENTS

| | | |
|---|---|---|
| 0044384 | 1/1982 | European Pat. Off. |
| 44384 | 1/1982 | European Pat. Off. |
| 0227549 | 7/1987 | European Pat. Off. |
| 0433174 | 6/1991 | European Pat. Off. |
| 59-6581 | 1/1984 | Japan |

Primary Examiner—Joseph A. Popek
Assistant Examiner—F. Niranjan
Attorney, Agent, or Firm—Robert Groover; Betty Formby

[57] ABSTRACT

An integrated circuit unerasable memory cell which includes at least one memory cell consisting of a floating gate transistor with drain, source, and gate terminals, and a metallic shield embedded in the semiconductor substrate and covering the cell. Also provided are a diffused region defining a closed loop path on the substrate surface all around the transistor, and having said shield connected peripherally thereto in an unbroken fashion, and first and second wells extending in the substrate from the transistor to outside the diffused region, the first of said wells being connected directly to the gate terminal of the transistor. A contact inside the shield connects the shield's top surface to the cell's source. A protection diode (inside the shield) prevents charging of the floating gate during manufacture.

30 Claims, 3 Drawing Sheets

INTEGRATED CIRCUIT ENTIRELY PROTECTED AGAINST ULTRAVIOLET RAYS

CROSS-REFERENCE TO RELATED APPLICATION

This application claims priority from EPC App'n 9283339.5, filed Jun. 30, 1992, which is hereby incorporated by reference.

BACKGROUND AND SUMMARY OF THE INVENTION

This invention relates to an integrated circuit which is fully protected from UV radiation, being of a type implemented in MOS technology over a semiconductor substrate and which includes at least one memory cell with a floating gate transistor having drain, source, and gate terminals, and a metallic shield embedded in the semiconductor substrate and covering said cell.

The field of application of this invention relates, particularly but not solely, to CMOS technology integrated circuits incorporating EPROM memory cells with floating gate MOS transistors, and the description to follow will make reference to this field of application for simplicity of illustration.

As is known, non-volatile memory cells of the EPROM type are written electrically and cleared by means of ultraviolet beams. It is also well recognized that in the manufacture of integrated circuits incorporating EPROM memory cells, allowance must be made for spare or redundant portions, i.e. portions which can replace memory areas rendered inoperative by any designing flaws. To permit appropriate selection of such redundancy (to fix the defects of a particular chip), some technique must be used to permanently encode the necessary information on-chip. This allows access paths to be established which either enable or inhibit readout of selected memory areas.

An old technique for such selection used thin-film fuse elements: each fuse, when blown, would provide a permanent memory corresponding to one bit of data. However, actual fuses have many disadvantages, so that such fuses have normally been replaced by memory cells of the EPROM type, i.e. floating gate MOS devices. Such cells are inherently and unavoidably responsive to UV radiation: when UV photons are absorbed in or near the floating gate, the resulting carriers will be "hot", i.e. sufficiently energetic to travel through a dielectric. Thus, when exposed to UV radiation, the floating gates may lose their electric charge and, consequently, the information represented thereby. (For this reason, ultraviolet flood illumination is commonly used to erase EPROMs.)

In such fuse-like functional applications of EPROM cells, the EPROM cell must therefore be protected against ultraviolet light. This is particularly necessary because EPROM circuits themselves will normally be exposed to UV by users who wish to erase them. Thus, if redundancy is to be useful in repairing EPROM chips, the redundancy selection data must not be wiped out by the UV exposures normally applied by users!

The prior art has therefore proposed to screen the EPROM cell by means of a metallization shield, e.g. one formed from an aluminum thin film connected to the substrate of the semiconductor IC. That is, in this approach the EPROM cell is covered with a squared up conductive layer of aluminum which is connected along three sides to the silicon substrate, as previously made conductive by an appropriate doping step. In this way, the UV radiation will be reflected from the thin film metal, and the corresponding EPROM cell may be regarded as an UPROM (Unerasable Programmable ROM) structure.

Some implementations of UPROM cells have had the drawback that at least one side of the aluminum covering is left exposed, in order to permit the drain, source, and floating gate terminals of the MOS transistor in the memory cell to be biased. As a result, ultraviolet light is admitted inside through this unconnected side to the substrate and allowed to propagate therein until it indirectly reaches the floating gate. As a consequence, the immunity of a cell so protected to UV radiation is bound to only last a few weeks.

To obviate this drawback, the prior art has proposed that meanders of suitably doped silicon be formed on the semiconductor for communicating the bias to the aforesaid drain, source and gate terminals. (Along these meanders, the ultraviolet light is repeatedly reflected and absorbed such that it can no longer reach the floating gate with sufficient intensity to remove the charge therefrom and, hence, alter its logic value.) However, this prior art approach has the disadvantage that it takes up valuable space on the integrated circuit.

A totally enclosed cell is provided by published European application 0-433-174-A1, corresponding to U.S. Pat. No. 5,235,541 ("Integrated Circuit Entirely Protected against Ultraviolet Rays"). This application (of common ownership with the present application) describes a totally enclosed two-bit EEPROM cell, in which well diffusions are used to route incoming lines beneath the shallow diffusion at the sidewalls of the metal shield.

The present invention provides a totally enclosed UPROM cell which has a simpler and more compact structure, and has several notable features. This memory cell, in the presently preferred embodiment, uses a conventional EPROM cell architecture (with the control gate overlying the floating gate). Connections for the control gate and the drain (but not the source) are routed underneath the metal enclosure using well diffusions. The source diffusion is simply connected to the metal covering (which is grounded).

For manufacturing reliability, a protection diode is included inside the metal enclosure. This protection diode is a diffusion connected to the control gate, and will be reverse-biased during normal operation. However, this protection diode serves the important purpose of preventing the floating gate from becoming charged up during manufacturing. (Any charge trapped at this stage would be no longer removable by UV radiation.)

According to one embodiment of the disclosed innovations, there is provided: an integrated circuit memory cell which is fully protected from UV radiation, being of a type implemented in MOS technology over a semiconductor substrate, comprising: at least one memory transistor having source and drain diffusions and a channel separating the source and drain, and having at least one gate overlying and insulated from and capacitively coupled to at least a portion of the channel; a metallic shield embedded in the semiconductor substrate and covering the transistor, a diffused region defining a closed loop path on the substrate surface all around the transistor, the shield being peripherally connected to the diffused region in an unbroken fashion, and first and second wells extending in the substrate from the transistor to outside the diffused region, the first of the wells being connected directly to the gate terminal of the transistor.

According to another embodiment of the disclosed innovations, there is provided: an integrated circuit, comprising: a body having a surface portion of substantially monolithic semiconductor material of a first conductivity type; a floating-gate transistor, which includes surface source and drain diffusions of a second conductivity type in the surface portion, a channel in the surface portion separating the source and drain, a floating gate overlying and insulated from and capacitively coupled to at least a portion of the channel, and a control gate overlying and insulated from and capacitively coupled to at least a portion of the floating gate; a protection diode, comprising a surface diffusion of the second conductivity type which is connected to the control gate; a metal shield overlying and completely laterally surrounding the transistor and the protection diode; a first deep diffusion of the second conductivity type connected to the control gate and extending out underneath the metal shield to a gate contact location which is outside the shield; and a second deep diffusion of the second conductivity type connected to the drain and extending out underneath the metal shield to a drain contact location which is outside the shield.

According to another embodiment of the disclosed innovations, there is provided: an integrated circuit, comprising: a body having a surface portion of substantially monolithic semiconductor material of a first conductivity type; a floating-gate transistor, which includes surface source and drain diffusions of a second conductivity type in the surface portion, a channel in the surface portion separating the source and drain, a floating gate overlying and insulated from and capacitively coupled to at least a portion of the channel, and a control gate overlying and insulated from and capacitively coupled to at least a portion of the floating gate; a protection diode, comprising a surface diffusion of the second conductivity type which is connected to the control gate; a metal shield having a top portion which is horizontally extended to overlie the transistor and the protection diode, and a side portion which extends down from the top portion to make contact to the surface in a continuous ring which completely laterally surrounds the transistor, the shield also being connected, separately from the side portion thereof, to a shallow diffusion of the first conductivity type in the surface portion; a first deep diffusion of the second conductivity type connected to the control gate and extending out underneath the metal shield and the shallow diffusion to a gate contact location which is outside the shield; and a second deep diffusion of the second conductivity type connected to the drain and extending out underneath the metal shield and the shallow diffusion to a drain contact location which is outside the shield.

The features and advantages of the inventive circuit will become apparent from the following detailed description of an embodiment thereof, given by way of non-limitative example with reference to the accompanying drawings.

BRIEF DESCRIPTION OF THE DRAWING

The present invention will be described with reference to the accompanying drawings which show important sample embodiments of the invention and which are incorporated in the specification hereof by reference, wherein.

DESCRIPTION OF THE PREFERRED EMBODIMENTS

Figure 1:
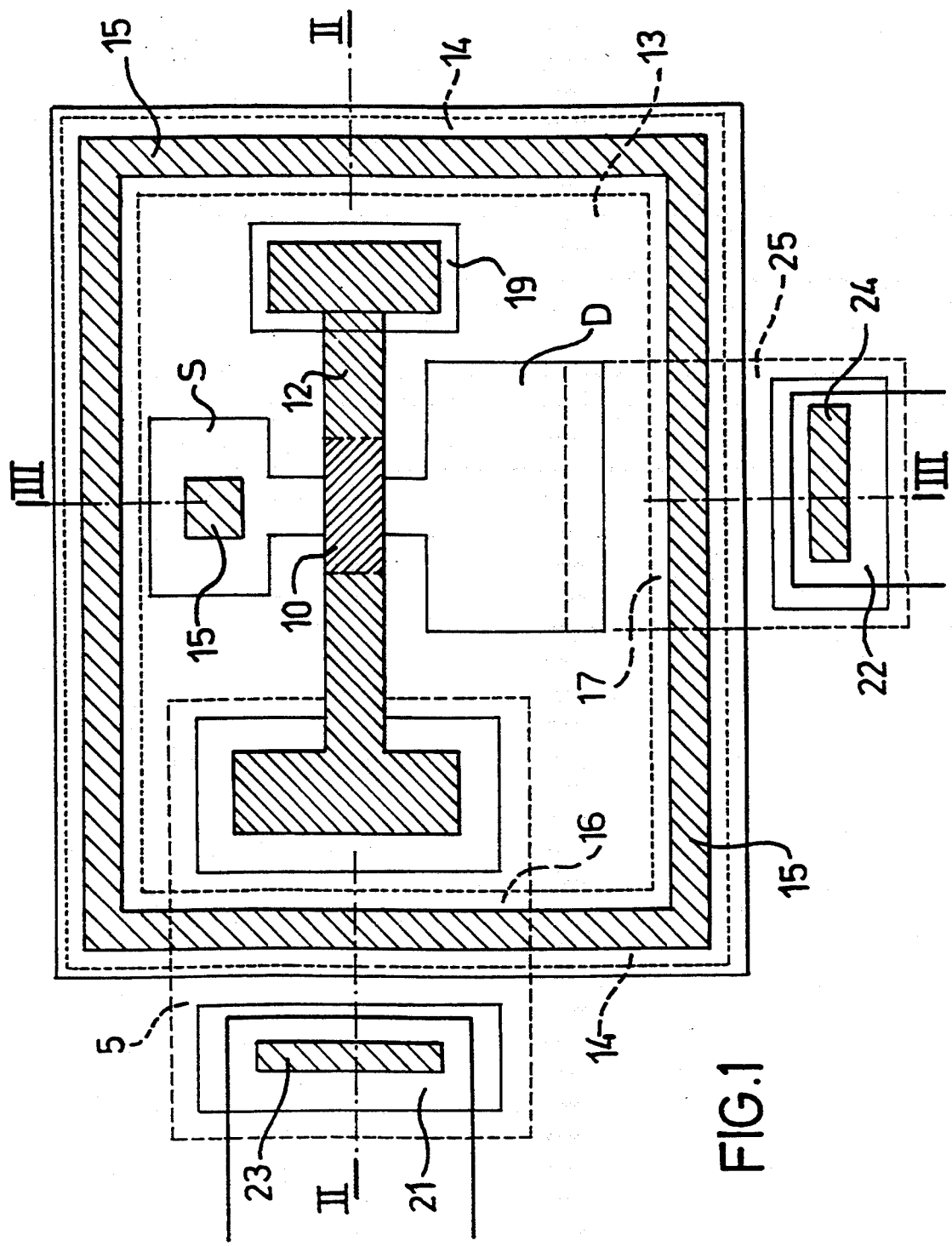
FIG. 1 is a top plan view showing schematically the integrated circuit of this invention.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

With reference to the drawing views, generally and schematically shown at is an integrated circuit embodying this invention.

The circuit comprises at least one memory cell implemented in either MOS or CMOS technology and consisting of a floating gate MOS transistor 3.

The circuit is formed over a P-type semiconductor silicon substrate 4, wherein first 5 and second 25 diffused regions of the N-well type are formed.

Taking the horizontal plane of the substrate 4 as the reference plane, these regions 5 and 25, better known as wells, extend substantially along mutually perpendicular axes.

Advantageously, the circuit is also provided with a diffused region 14 defining a closed loop path and being doped similar to the substrate, e.g. using dopant of the P+ type (from the P+ source/drain implant). This ring-like region 14 is formed on the surface of the substrate 4, and laterally surrounds the cell. Respective portions 16 and 17 of this region 14 also intersect the wells 5 and 25 superficially.

Formed on the first well 5 are two discrete active areas 20 and 21. These active areas are doped N+ (by the N+ source/drain implant) and are located on opposed sides of portion 16 of the diffused region 14.

The second well 25 also includes an N+ active area 22 formed outside the ring region 14.

Figure 3:
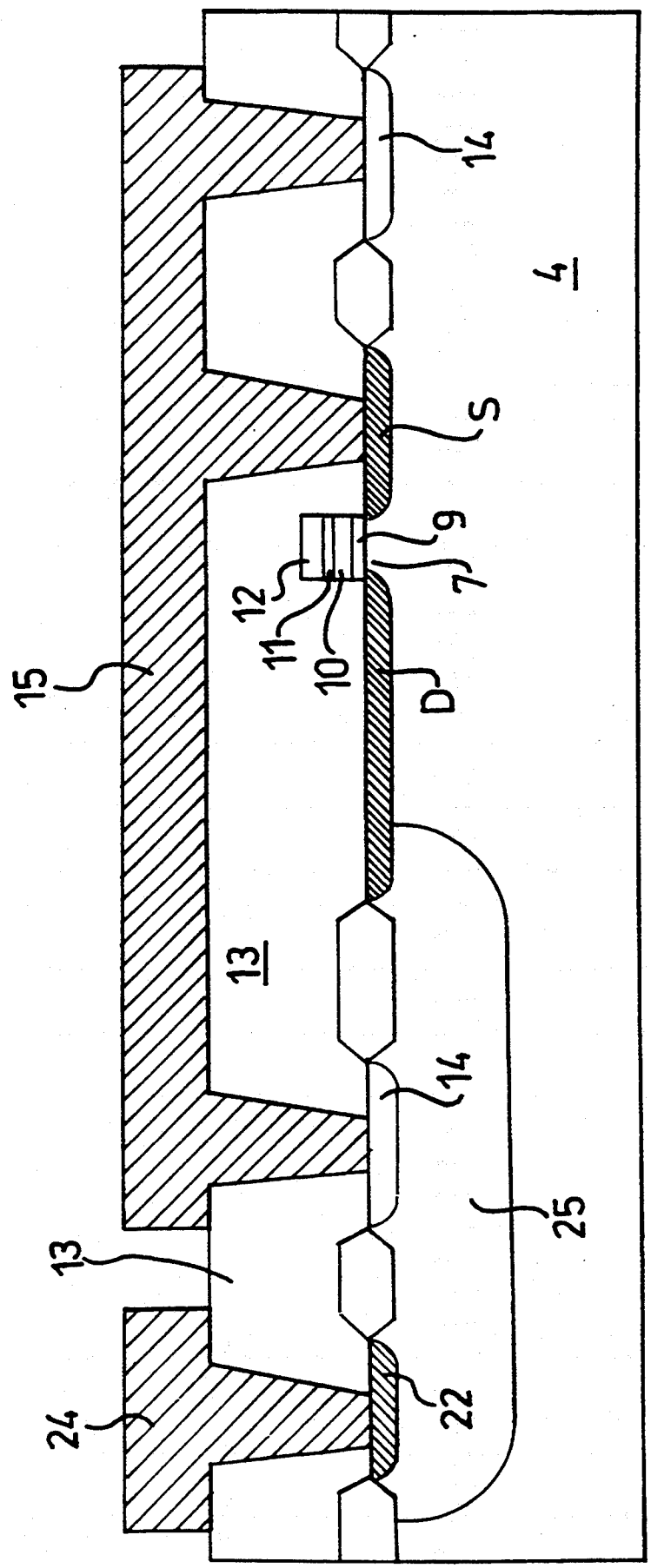
FIG. 3 is a schematic cross-section view of the circuit in FIG. 1, taken along line III—III.

As shown in FIG. 3, the transistor 3 has an implanted channel 7 which is bordered by opposed source and drain N+ active areas denoted by the reference characters S and D. The drain active area D extends as far as the second well 25 and forms a junction therewith.

Figure 2:
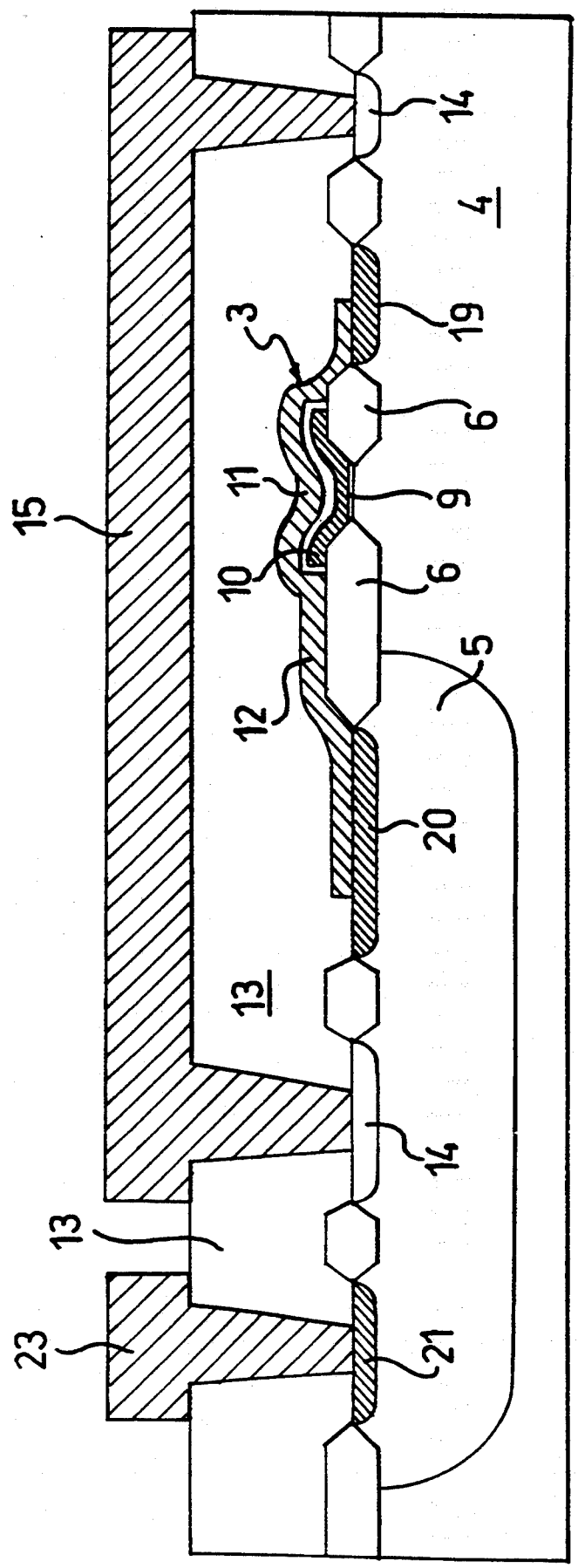
FIG. 2 is a schematic cross-section view of the circuit in FIG. 1, taken along line II—II.

Channel 7 is also shown in FIG. 2 on a different vertical section plane, and is bound by isolating regions 6 which are formed from so-called field oxide.

In addition, a thin layer 9 of gate oxide is grown over the channel 7, and this basic structure is covered with a first layer 10 of polycrystalline silicon, in turn covered with a dielectric layer 11. The layer 10 forms the so-called floating gate of transistor 3.

A second layer 12 of polycrystalline silicon covers the entire structure so far described and extends from the first active region 20 of the well 5 to a third active region 19 formed beside transistor 3, on the side away from well 5. This layer 12, which is connected directly to these areas 20 and 19, constitutes the control gate terminal for the transistor 3.

An intervening dielectric layer 13, deposited on the surface of the substrate 4 and over the transistor 3, protects and isolates superficially the whole circuit 1.

Advantageously, according to the invention, a metallic shield 15 is provided which may be made of aluminum and is embedded peripherally in the substrate 4 to cover the memory cell. More specifically, the shield 15 covers the intervening dielectric layer 13 above the cell and is connected peripherally in an unbroken fashion to the ring region 14 so as to penetrate said dielectric layer 13.

Thus, the region 14 will provide an active area of contact with the substrate 4 for the metallization shield 15, which is adapted to protect the cell from UV radiation.

The shield 15 is also connected, again through the dielectric layer 13, to the active source area S of transistor 3, to also function as the source electrode thereof.

It may be appreciated from the foregoing description that the memory cell is substantially enclosed within a protective shell comprising the substrate 4 and metallization shield 15. The latter functions to effectively screen off the UV radiation by presenting a reflective surface thereto.

The drain, source and gate terminals of transistor 3 are, in turn, enclosed within said protective shell, and that adequate bias must therefore be provided for them. For this purpose, the wells 5 and 25 have been provided in accordance with this invention.

Each of these wells 5 and 25 extends in the substrate 4 beyond the ring perimeter P+ consisting of the diffused region 14, and toward the cell. They form substantially two diodes having reversed bias compared to circuit 1 operating voltages and do not drive current to the substrate 4.

The second well 25 biases the drain terminal D of transistor 3.

The first well 5 allows the control gate of transistor 3 to become biased as a result of the direct contact established between the second layer 12 of polycrystalline silicon and the first active area 20 incorporated to the well 5. The active area 20 is doped by diffusion through the layer of polycrystalline silicon as previously deposited and doped.

The above-mentioned direct contact and N+ diffusion of the well 5 ensure electrical continuity with the second active area 21 in the well 5, but are located outside of the diffused region 14.

In essence, this second active area 21 may be regarded for all purposes as the control gate of transistor 3.

Likewise, the active area 22 incorporated to the second well 25 functions as the drain electrode for the transistor 3. Each active area, 21 or 22, is obviously reached by a corresponding metallization electrode 23, 24.

It should be noted, lastly, that present in the substrate 4 is also a protection diode provided by the active area 19 associated with the cell. This active area 19 is also connected directly to the layer 12 of polycrystalline silicon, but is reverse biased compared to the operating voltages of the transistor 3; it serves to protect the dielectric layers 9 and 11 of the control gate during the circuit manufacturing process.

The diode 19 is made operative at a relatively early stage in the process. Its presence prevents the floating gate from being charged during the manufacturing process, e.g. during plasma etching of the layer 12 of polycrystalline silicon ("poly-2") which forms the control gate. Any charge trapped on the floating gate at this stage would be no longer removable by UV radiation (since the cell of this invention has now been so effectively protected from this very radiation).

The inventive circuit solves the technical problem and provides full screening from UV radiation, since the metallization shield 15 is connected peripherally to the substrate all around it, and fully covers the memory cell. However, this does not impair proper biasing of the cell's floating gate transistor, since the combined provision of wells 5 and 25 is effective to transfer the bias from external terminals to the transistor inside the UV radiation screening shell.

The disclosed structure further affords a major advantage in that it can be made highly compact and would occupy a smaller area in the circuit than prior art approaches. It also lends itself for association in modular form with other similar memory cells sharing the source and control gate electrodes.

It should be also noted that the inventive structure is compatible with those technologies which provide for the contacts to be formed by filling methods based on the deposition and subsequent removal of material from those portions which represent no contact portions. This is made possible by the contact pattern exhibiting no crossings from which the filling material might be partially or fully removed.

Further, no additional masks are required to make such a structure.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, by replicating the layout of the presently preferred embodiment in a mirror image fashion, a modification can easily be made which would include more than one (e.g. two or four) bits of memory inside a common metal shield. In this case the source terminal and/or the protection diode can be shared between adjacent cells.

For another example, in processes which have other diffusions available, the deep diffusions do not strictly have to be made in the same step as the N-well.

For another example, the top and sidewalls of the shield do not have to be made of the same metal. In many filled-contact processes the contacts may be filled by one or more metals or metallic materials (such as TiN, W, TiW, etc.) which are different from the composition used for the primary metallization layer(s).

For another example, metallization layer does not have to be merely aluminum, but can be alloyed with silicon, copper), or layered with another metal, or made of a different metal altogether. As long as the metal chosen is reasonably opaque to ultraviolet light, the choice of metallization will primarily be dictated by more general processing concerns.

For another example, the disclosed innovative structure is not strictly limited to floating-gate memory transistors, but can also (alternatively and less preferably) be used with other types of memory transistors, such as MNOS or other layered-dielectric devices.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit memory cell which is fully protected from UV radiation, being of a type implemented in MOS technology over a semiconductor substrate comprising:
   at least one memory transistor having source and drain diffusions and a channel separating said source and drain, and having at least one gate overlying and insulated from and capacitively coupled to at least a portion of said channel;
   a metallic shield embedded in the semiconductor substrate and covering said transistor,
   a diffused region defining a closed loop path on the substrate surface all around said transistor, said shield being peripherally connected to said diffused region in an unbroken fashion, and
   first and second wells extending in the substrate from the transistor to outside said diffused region, the first of said wells being connected directly to said gate of said transistor, and
   a protection diode connected to said control gate and located inside the closed loop path defined by said diffused region.

2. An integrated circuit according to claim 1, wherein said shield is also the source electrode of the transistor.

3. An integrated circuit according to claim 1, wherein said diffused region is ring-shaped.

4. An integrated circuit according to claim 1, wherein said first well comprises first and second active areas on opposed sides of said diffused region, said first active area being in direct contact with a deposition layer constituting the gate terminal of the transistor.

5. An integrated circuit according to claim 1, wherein said diode consists of an active area formed adjacent to said cell in direct contact with the gate terminal of the transistor.

6. An integrated circuit according to claim 1, wherein said diode is reverse biased at the normal operating voltage of said transistor.

7. An integrated circuit according to claim 1, wherein said second well extends from an active drain area of the transistor to another active area outside the closed loop path defined by said diffused region.

8. An integrated circuit, comprising:
   a body having a surface portion of substantially monolithic semiconductor material of a first conductivity type;
   a floating-gate transistor, which includes surface source and drain diffusions of a second conductivity type in said surface portion, a channel in said surface portion separating said source and drain, a floating gate overlying and insulated from and capacitively coupled to at least a portion of said channel, and a control gate overlying and insulated from and capacitively coupled to at least a portion of said floating gate;
   a protection diode, comprising a surface diffusion of said second conductivity type which is connected to said control gate;
   a metal shield overlying and completely laterally surrounding said transistor and said protection diode;
   a first deep diffusion of said second conductivity type connected to said control gate and extending out underneath said metal shield to a gate contact location which is outside said shield; and
   a second deep diffusion of said second conductivity type connected to said drain and extending out underneath said metal shield to a drain contact location which is outside said shield.

9. The integrated circuit of claim 8, wherein said shield encloses only one of said transistors.

10. The integrated circuit of claim 8, wherein said shield comprises a thin film of an aluminum alloy.

11. The integrated circuit of claim 8, wherein said first conductivity type is P-type.

12. The integrated circuit of claim 8, further comprising a plurality of N-wells which include P-channel field-effect transistors, and wherein each said deep diffusion is formed simultaneously with said N-wells.

13. The integrated circuit of claim 8, wherein said shield is connected to a shallow diffusion of said first conductivity type in said surface portion.

14. An integrated circuit, comprising:
   a body having a surface portion of substantially monolithic semiconductor material of a first conductivity type;
   a floating-gate transistor, which includes surface source and drain diffusions of a second conductivity type in said surface portion, a channel in said surface portion separating said source and drain, a floating gate overlying and insulated from and capacitively coupled to at least a portion of said channel, and a control gate overlying and insulated from and capacitively coupled to at least a portion of said floating gate;
   a protection diode, comprising a surface diffusion of said second conductivity type which is connected to said control gate;
   a metal shield having a top portion which is horizontally extended to overlie said transistor and said protection diode, and a side portion which extends down from said top portion to make contact to said surface in a continuous ring which completely laterally surrounds said transistor, said shield also being connected, separately from said side portion thereof, to a shallow diffusion of said first conductivity type in said surface portion;
   a first deep diffusion of said second conductivity type connected to said control gate and extending out underneath said metal shield and said shallow diffusion to a gate contact location which is outside said shield; and
   a second deep diffusion of said second conductivity type connected to said drain and extending out underneath said metal shield and said shallow diffusion to a drain contact location which is outside said shield.

15. The integrated circuit of claim 14, wherein said shield encloses only one of said transistors.

16. The integrated circuit of claim 14, wherein said first conductivity type is P-type.

17. The integrated circuit of claim 14, wherein said top portion of said shield comprises a thin film of an aluminum alloy.

18. The integrated circuit of claim 14, further comprising a plurality of N-wells which include P-channel field-effect transistors, and wherein each said deep diffusion is formed simultaneously with said N-wells.

19. The integrated circuit of claim 14, further comprising a plurality of P-channel field-effect transistors, and wherein said shallow diffusion is formed simultaneously with source/drain regions of said P-channel transistors.

20. An integrated circuit memory cell which is fully protected from UV radiation, comprising:
at least one memory transistor, in a semiconductor substrate, having first and second source/drain diffusions laterally separated by a channel region, and having at least one gate overlying and insulated from and capacitively coupled to at least a portion of said channel;
a metallic shield embedded in said semiconductor substrate and covering said transistor,
a diffused region defining a closed loop path, on the surface of said substrate, which totally surrounds said transistor, said shield being peripherally connected to said diffused region in an unbroken fashion, and
a plurality of wells, each separably extending in the substrate from inside said diffused region to outside said diffused region, a first one of said wells being connected to said gate of said transistor, and a second one of said wells being connected to said first source/drain region of said transistor;
said second source/drain region of said transistor being operatively connected to said shield, but not to any of said wells.

21. An integrated circuit according to claim 20, wherein said diffused region is ring-shaped.

22. An integrated circuit according to claim 20, wherein said first well comprises first and second active areas on opposed sides of said diffused region, said first active area being in direct contact with a deposition layer constituting the gate terminal of the transistor.

23. An integrated circuit according to claim 20, further comprising a protection diode connected to said control gate and located inside the closed loop path defined by said diffused region.

24. An integrated circuit according to claim 23, wherein said diode consists of an active area formed adjacent to said cell in direct contact with the gate terminal of the transistor.

25. An integrated circuit according to claim 23, wherein said diode is reverse biased at the normal operating voltage of said transistor.

26. An integrated circuit memory cell which is fully protected from UV radiation, comprising:
at least one n-channel memory transistor having source and drain diffusions, in a semiconductor substrate, laterally separated by a channel region in said semiconductor substrate, and having at least one gate overlying and insulated from and capacitively coupled to at least a portion of said channel;
a metallic shield embedded in said semiconductor substrate and having a top portion covering said transistor and having sidewall portions which extend down to said substrate and which totally surround said transistor laterally;
first and second wells, each separately extending in the substrate from inside said shield to outside said shield, said first well being connected to said gate of said transistor, and said second well being connected to said drain of said transistor; and
a vertical connection from said top portion of said shield to said source region of said transistor, said vertical connection being metallic and being separate from said sidewall portions of said shield.

27. An integrated circuit according to claim 26, further comprising a diffused region, of an opposite conductivity type to said wells, which is located in said substrate wherever said sidewalls of said shield make contact to said substrate.

28. An integrated circuit according to claim 26, further comprising a protection diode connected to said gate and located inside the closed loop path defined by said sidewalls of said shield.

29. An integrated circuit according to claim 28, wherein said diode consists of an active area formed adjacent to said cell in direct contact with the gate terminal of the transistor.

30. An integrated circuit according to claim 28, wherein said diode is reverse biased at the normal operating voltage of said transistor.

* * * * *